(12) United States Patent
Han

(10) Patent No.: US 8,673,659 B2
(45) Date of Patent: Mar. 18, 2014

(54) METHOD OF FABRICATING SEMICONDUCTOR DEVICE INCLUDING PROCESS MONITORING PATTERN HAVING OVERLAPPING INPUT/OUTPUT PAD ARRAY AREA

(71) Applicant: Dong-Hyun Han, Gunpo-si (KR)

(72) Inventor: Dong-Hyun Han, Gunpo-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/861,984

(22) Filed: Apr. 12, 2013

(65) Prior Publication Data

US 2013/0273726 A1    Oct. 17, 2013

Related U.S. Application Data

(62) Division of application No. 12/962,991, filed on Dec. 8, 2010, now Pat. No. 8,445,907.

(30) Foreign Application Priority Data

Feb. 4, 2010 (KR) .................. 10-2010-0010515

(51) Int. Cl.
*H01L 21/44* (2006.01)
(52) U.S. Cl.
USPC ....... 438/16; 438/612; 438/675; 257/E23.179
(58) Field of Classification Search
CPC .................. H01L 21/28008; H01L 21/28158
USPC .................................... 257/619, 739
See application file for complete search history.

(56) References Cited

U.S. PATENT DOCUMENTS

| 6,602,725 | B2 | 8/2003 | Sakai et al. |
| 6,670,708 | B2 | 12/2003 | Choo et al. |
| 7,232,698 | B2 | 6/2007 | Kim |
| 7,517,762 | B2 * | 4/2009 | Kim et al. ...................... 438/281 |
| 7,994,613 | B2 | 8/2011 | Jung |
| 2001/0054768 | A1 | 12/2001 | Kim |
| 2010/0102318 | A1 | 4/2010 | Han |

FOREIGN PATENT DOCUMENTS

| KR | 2020040017374 | 6/2004 |
| KR | 1020040058651 | 7/2004 |
| KR | 1020060046876 | 5/2006 |
| KR | 1020080040811 | 5/2008 |

* cited by examiner

*Primary Examiner* — Stephen W Smoot
(74) *Attorney, Agent, or Firm* — Harness, Dickey Pierce, P.L.C.

(57) ABSTRACT

The semiconductor device includes a process monitoring pattern and an input/output (I/O) pad array area, the process monitoring pattern including a lower layer having a peripheral area surrounding a first internal area, the first internal area exposed by an internal open area, an external structure on the peripheral area of the lower layer, and a first dam disposed in the peripheral area spaced apart from the external structure by an external open area, the first dam defining the first internal area. The peripheral area overlaps the input/output (I/O) pad array area of the semiconductor device.

10 Claims, 16 Drawing Sheets

METHOD OF FABRICATING SEMICONDUCTOR DEVICE INCLUDING PROCESS MONITORING PATTERN HAVING OVERLAPPING INPUT/OUTPUT PAD ARRAY AREA

CROSS-REFERENCE TO RELATED APPLICATION

This application is a divisional application of U.S. application Ser. No. 12/962,991, filed Dec. 8, 2010, now U.S. Pat. No. 8,445,907, which claims priority under 35 U.S.C. §119 to Korean Patent Application No. 10-2010-0010515 filed on Feb. 4, 2010, the disclosure of which is hereby incorporated by reference in its entirety.

BACKGROUND

1. Field

Example embodiments of the inventive concepts relate to a semiconductor device and a method of fabricating the same, and more particularly, to technology for improving the productivity of semiconductor devices.

2. Description of Related Art

To improve the productivity of semiconductor devices, a method of increasing the number of semiconductor chips per wafer may be used. A process of fabricating semiconductor devices is performed in units of wafers, and thus the cost of processing each wafer is the same. Thus, when semiconductor chips obtained by processing one wafer are increased, reducing costs of the semiconductor devices and increasing the yield and productivity of the semiconductor devices is possible.

SUMMARY

The present invention provides a semiconductor device including a monitoring pattern in an input/output (I/O) pad array area. The present invention also provides a semiconductor module, an electronic circuit board, and an electronic system including the semiconductor device including a monitoring pattern in an I/O pad array area. The present invention also provides a method of fabricating a semiconductor device including a monitoring pattern in an I/O pad array area.

In accordance with an example embodiment of the inventive concepts, the semiconductor device includes a process monitoring pattern and an input/output (I/O) pad array area, the process monitoring pattern including a lower layer having a peripheral area surrounding a first internal area, the first internal area exposed by an internal open area, an external structure on the peripheral area of the lower layer, and a first dam disposed in the peripheral area spaced apart from the external structure by an external open area, the first dam defining the first internal area. The peripheral area overlaps the input/output (I/O) pad array area of the semiconductor device.

In accordance with another example embodiment of the inventive concepts, a method of fabricating a semiconductor device includes forming a first insulating layer on a lower layer overlapping an input/output (I/O) pad array area, the lower layer having a peripheral area surrounding a first internal area; patterning the first insulating layer to form an external structure on the peripheral area, the peripheral area having a quadrangular shape; forming a first dam in the peripheral area spaced apart from the external structure, the first dam defining the first internal area and having a quadrangular band shape; and exposing a surface of the lower layer between the external structure and the external dam to form an external open area, and the first internal area to form an internal open area.

In accordance with still another example embodiment of the inventive concepts, a method of fabricating a semiconductor device includes forming a process monitoring pattern on a substrate, wherein forming the process monitoring pattern includes, forming a lower layer on the substrate, the lower layer having a peripheral area surrounding a first internal area, forming an external structure on the peripheral area, the peripheral area having a quadrangular shape, and forming a first dam in the quadrangular peripheral area, the first dam defining the first internal area; and forming an input/output (I/O) pad array area overlapping the peripheral area.

In accordance with yet another example embodiment of the inventive concepts, a semiconductor module includes a module board, a plurality of semiconductor devices disposed on the module board, and module contact terminals formed in a line at one edge of the module board and electrically connected with the semiconductor devices. At least one of the semiconductor devices includes a process monitoring pattern and an input/output (I/O) pad array area, the process monitoring pattern including a lower layer having a peripheral area surrounding a first internal area, the first internal area exposed by an internal open area, an external structure on the peripheral area of the lower layer, and a first dam disposed in the peripheral area spaced apart from the external structure by an external open area, the first dam defining the first internal area. The peripheral area overlaps the input/output (I/O) pad array area of the semiconductor device.

In accordance with yet another example embodiment of the inventive concepts, an electronic circuit includes a circuit board, a microprocessor disposed on the circuit board, a main storage circuit configured to communicate with the microprocessor, and an I/O signal processing circuit configured to exchange instructions with the microprocessor. The main storage circuit includes at least one semiconductor device. The semiconductor device includes a process monitoring pattern and an input/output (I/O) pad array area, the process monitoring pattern including a lower layer having a peripheral area surrounding a first internal area, the first internal area exposed by an internal open area, an external structure on the peripheral area of the lower layer, and a first dam disposed in the peripheral area spaced apart from the external structure by an external open area, the first dam defining the first internal area. The peripheral area overlaps the input/output (I/O) pad array area of the semiconductor device.

In accordance with yet another example embodiment of the inventive concepts, an electronic system includes a control unit, an I/O unit, and a storage unit. The storage unit includes at least one semiconductor device. The semiconductor device includes a process monitoring pattern and an input/output (I/O) pad array area, the process monitoring pattern including a lower layer having a peripheral area surrounding a first internal area, the first internal area exposed by an internal open area, an external structure on the peripheral area of the lower layer, and a first dam disposed in the peripheral area spaced apart from the external structure by an external open area, the first dam defining the first internal area. The peripheral area overlaps the input/output (I/O) pad array area of the semiconductor device.

Other details of example embodiments of the inventive concepts are included in detailed description and drawings.

BRIEF DESCRIPTION OF THE DRAWINGS

The foregoing and other features and advantages of the inventive concepts will be apparent from the more particular description of example embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF EXAMPLE EMBODIMENTS

Figure 1A:
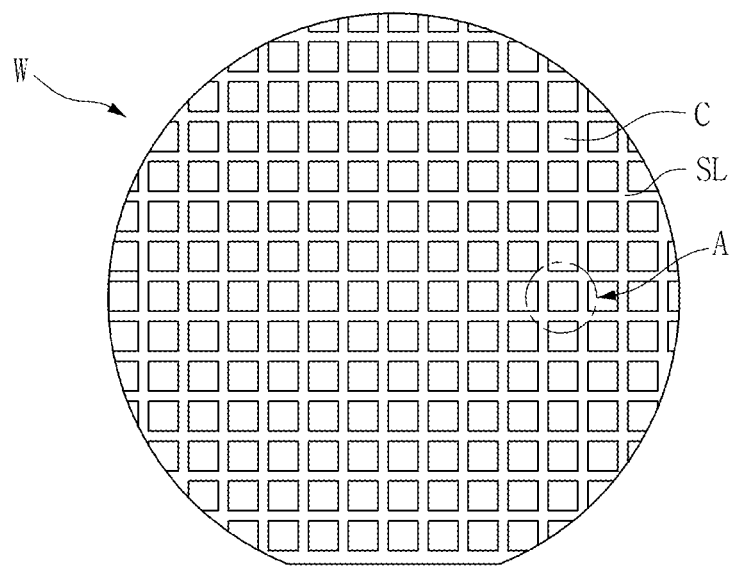
FIG. 1A is a schematic top view of a wafer that has been fabricated or is being fabricated according to an example embodiment of the inventive concepts.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to longitudinal sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
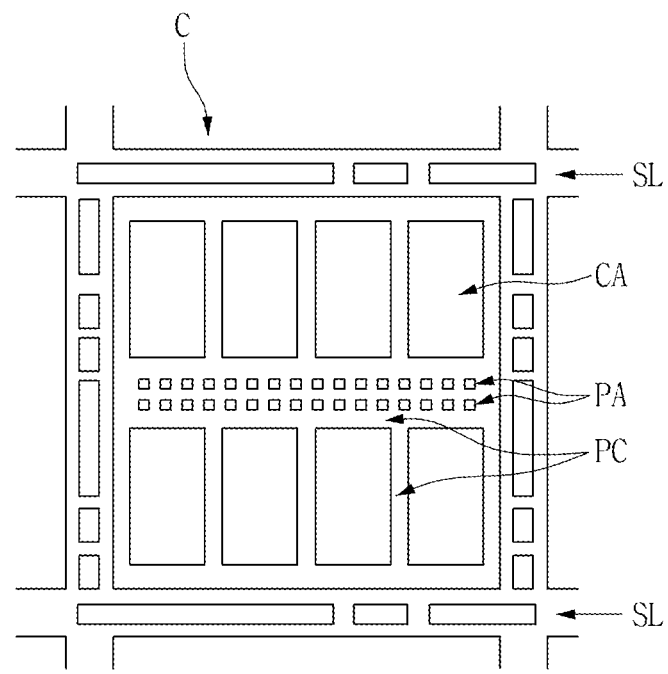
FIG. 1B is an enlarged view of an area A shown in FIG. 1A.

FIG. 1A is a schematic top view of a wafer that has been fabricated or is being fabricated according to an example embodiment of the inventive concepts, and FIG. 1B is an enlarged view of an area A shown in FIG. 1A. Referring to FIG. 1A, several tens to hundreds of semiconductor chips C are arranged in the form of a lattice on a wafer W. Scribe lanes SL are between the semiconductor chips C. The wafer W may be a flat zone type or a notch type, and the drawings show the wafer W of the flat zone type as an example. The semiconductor chips C may also be formed in a variety of quadrangular shapes, and the drawings show the semiconductor chips C formed in a square shape as an example.

Referring to FIG. 1B, each of the semiconductor chips C includes cell arrays CA and peripheral circuit arrays PC. Among the peripheral circuit arrays PC, peripheral circuit arrays PC disposed at the center include plural input/output (I/O) pad array areas PA. In other words, the semiconductor chips C include the cell arrays CA and the peripheral circuit arrays PC as circuit areas and the I/O pad array areas PA as non-circuit areas. In other words, the semiconductor chips C include the circuit arrays CA and PC and the I/O pad array areas PA. The term "non-circuit areas" should not be interpreted as solely referring to the I/O pad array areas PA. In the external area of the semiconductor chips C, that is, the scribe lanes SL, a variety of test pattern areas and/or key pattern areas for alignment may be formed. Patterns formed in these pattern areas have various shapes according to needs. Also, to aid in understanding example embodiments of the inventive concepts, only the I/O pad array areas PA, and not particular circuit blocks, are shown in the peripheral circuit arrays PC.

As mentioned above, FIG. 1B is not a top view of a semiconductor chip in a specific semiconductor fabrication process but a top view of a semiconductor chip in a random one of all semiconductor fabrication processes. According to an example embodiment of the inventive concepts, at least one of the plural I/O pad array areas PA is formed to overlap a monitoring pattern. In an example embodiment of the inventive concepts, an I/O pad array area may denote a lower area of an I/O pad. Specifically, an I/O pad is formed to be exposed on a surface of the semiconductor device.

In other words, an I/O pad is one of the patterns formed on the highest level, and is formed near the back end process of semiconductor fabrication processes. In general, no pattern is formed in the I/O pad array areas PA before an I/O pad is formed. According to an example embodiment of the inventive concepts, monitoring patterns are formed in the I/O pad array areas PA before I/O pads are formed, so that an area on the wafer W occupied by the semiconductor chip C can be reduced, and the number of semiconductor chips on a wafer of a semiconductor process can be increased. Forming of monitoring patterns in the I/O pad array areas PA means that the monitoring patterns are formed to overlap the position where I/O pads are formed. In example embodiments, an I/O pad array area denotes an area under a position where an I/O pad is formed. Also, I/O pads, I/O pad array areas, and monitoring patterns have quadrangular shapes.

Figure 2A:
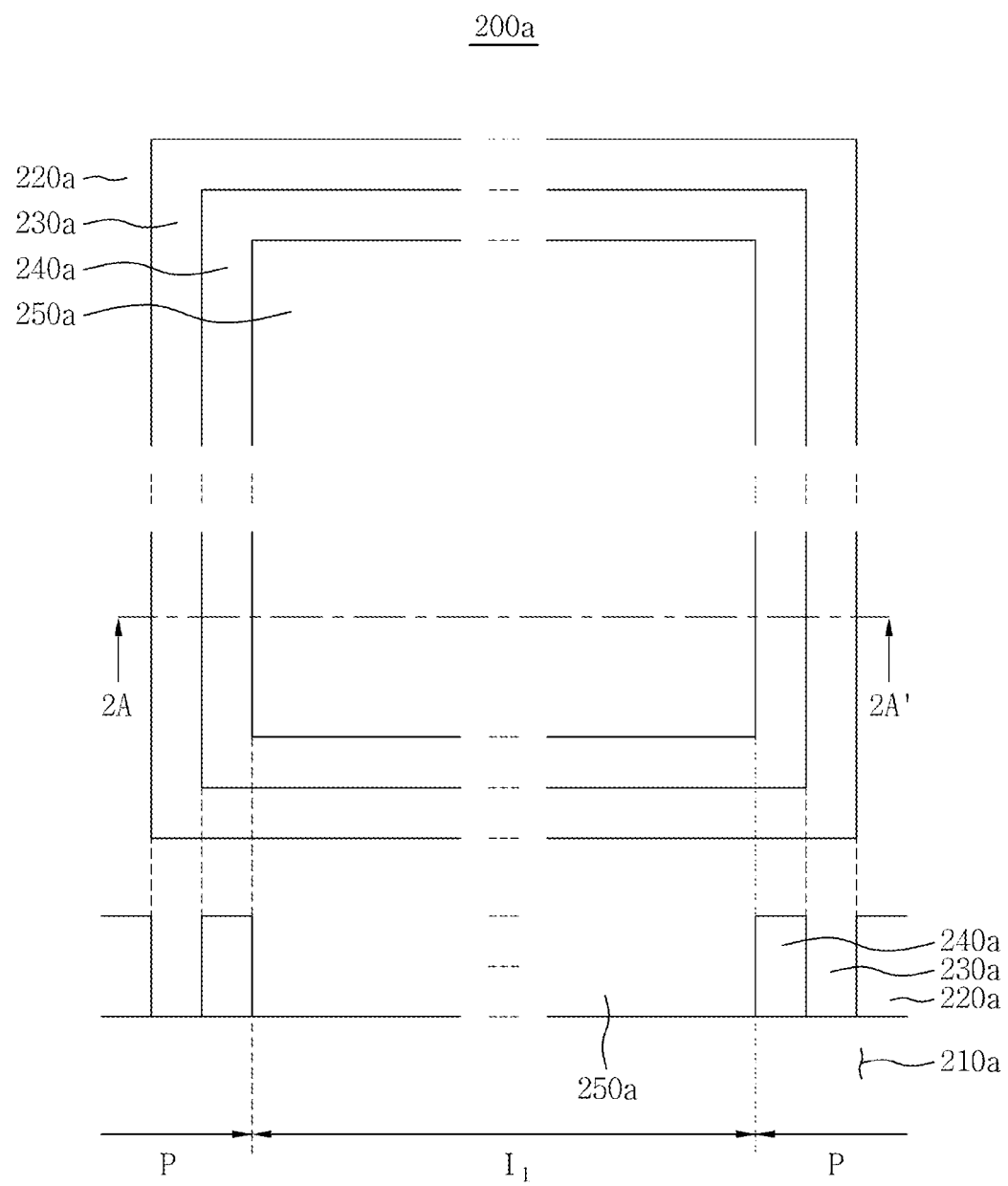
FIGS. 2A through 5B show top views and longitudinal sectional views of process monitoring patterns according to example embodiments of the inventive concepts.

FIG. 2A shows a schematic top view of a monitoring pattern formed in one of I/O pad array areas according to example embodiments of the inventive concepts, and a longitudinal sectional view of the monitoring pattern along line 2A-2A'. Referring to FIG. 2A, a monitoring pattern 200a is formed in an I/O pad array area. The monitoring pattern 200a may include a lower layer 210a, open areas 230a and 250a that expose a surface of the lower layer 210a, and dams 240a. The lower layer 210a may be a semiconductor substrate or an insulating layer. The lower layer 210a includes a peripheral area P and a first internal area $I_1$. Specifically, the lower layer 210a may include silicon, silicon oxide, silicon nitride, silicon oxynitride, a metal, a metal silicide, or a metal compound. The monitoring pattern 200a may be formed in external structures 220a.

The external structures 220a may define the peripheral area P overlapping an I/O pad array area, or the monitoring pattern 200a. The peripheral area P may be a quadrangular area. The external structures 220a may include silicon oxide. The external structures 220a may be formed on the same level as a material layer referred to as an interlayer insulating layer in a process of fabricating a cell area of a semiconductor device.

For example, the external structures 220a may be formed on the same level as an interlayer insulating layer that is formed on a semiconductor substrate to be in direct contact with a surface of the semiconductor substrate. In FIG. 2A, the external structures 220a may be formed directly on the lower layer 210a. The open areas 230a and 250a may include external open areas 230a and an internal open area 250a. The external open areas 230a may be separated from the internal open area 250a by the dams 240a. The external open areas 230a may be disposed between the external structures 220a and the dams 240a, and the internal open area 250a may be disposed in the dams 240a.

The external open areas 230a may be formed in a quadrangular band shape. The internal open area 250a may be formed in a square shape. The dams 240a may also be formed as a quadrangular band shape in the top view, and as a wall shape in the side view. The dams 240a may be formed to be a closed shape. In other words, the dams 240a may be formed in a single body without a discontinuous portion. As mentioned above, the dams 240a may be formed to the same height as an interlayer insulating layer in a process of fabricating a cell area of a semiconductor device. The dams 240a have no specific restrictions on their width, but may be formed to a width of 1 μm to 3 μm. The width of the dams 240a may be set to vary according to an experimentor's intention or a design rule, and characteristics of fabrication processes. The dams 240a may prevent or reduce movement of materials flowing from the external structures 220a, that is, the outside, to the internal open area 250a, that is, the inside.

For example, the dams 240a may prevent or reduce photoresist, an organic anti-reflection layer, a planarization material, etc. from excessively flowing to the internal open area 250a and deteriorating the characteristic of planarity. The flow of materials toward the internal open area 250a may cause the same result as applying a physical pressure to an edge, etc. of the external structures 220a. The monitoring pattern 200a, the I/O pad array area, etc. may not be accurately defined. One side of the external structures 220a, the external open areas 230a, or the dams 240a has a length similar to the size of the I/O pad array area, which is about several tens of micrometers. For example, the length may be 50 μm to 100 μm.

Since the external open areas 230a and the dams 240a have widths of several micrometers, the internal open area 250a has a much larger area than other components, and thus the flow of materials may cause a relatively large defect. The monitoring pattern 200a may be used to monitor a process of selectively removing a portion of an interlayer insulating layer during a process of fabricating a semiconductor device. For example, the monitoring pattern 200a may be used to monitor a process of forming a contact hole.

Figure 2B:
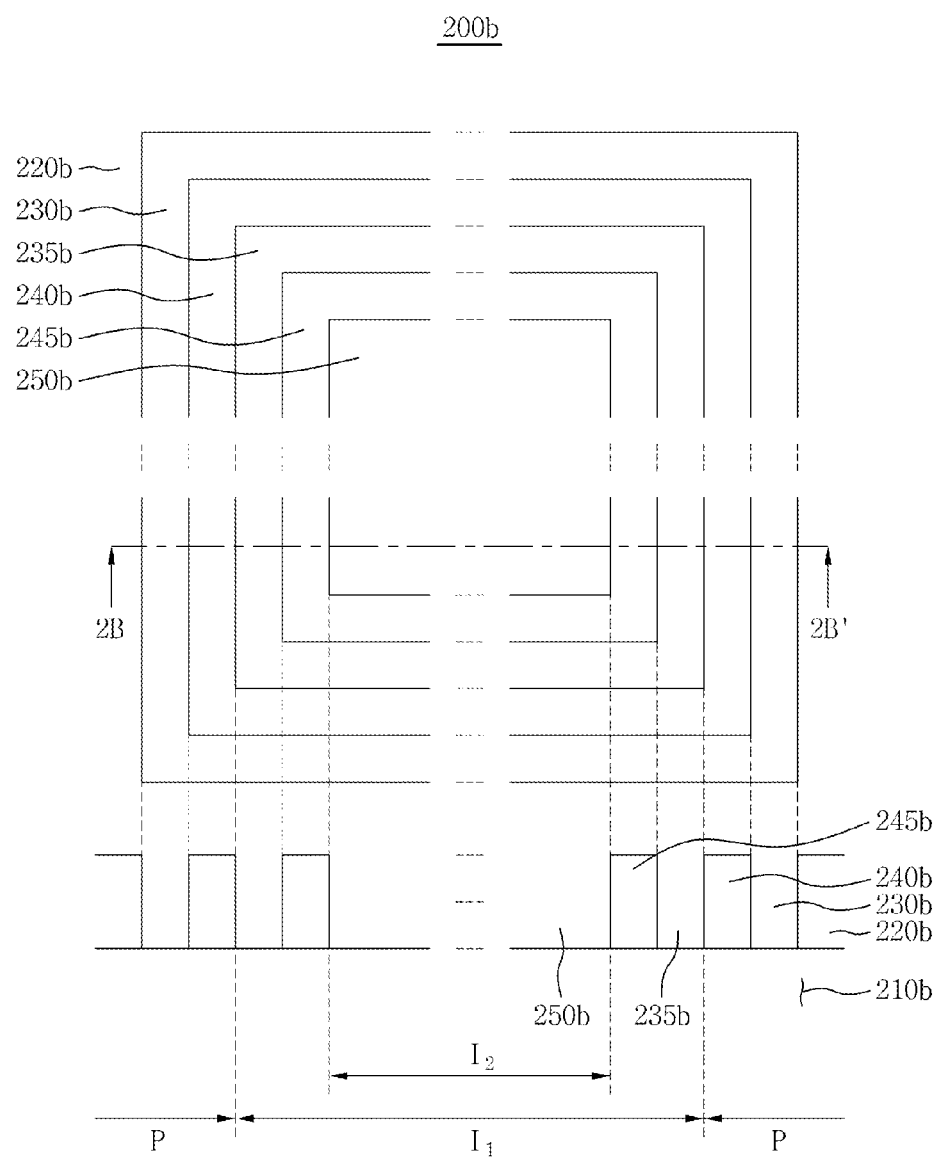

FIG. 2B shows a schematic top view of a monitoring pattern formed in one of I/O pad array areas according to example embodiments of the inventive concepts, and a longitudinal sectional view of the monitoring pattern along line 2B-2B'. Referring to FIG. 2B, a monitoring pattern 200b is formed in an I/O pad array area. The monitoring pattern 200b may include a lower layer 210b, open areas 230b, 235b and 250b that expose a surface of the lower layer 210b, and dams 240b and 245b. The open areas 230b, 235b and 250b may include external open areas 230b, middle open areas 235b and an internal open area 250b. The dams 240b and 245b may include first dams 240b and second dams 245b. The monitoring pattern 200b may also be formed in external structures 220b. The external structures 220b are described with reference to FIG. 2A.

The external open areas 230b may be formed between the external structures 220b and the first dams 240b. The middle open areas 235b may be formed between the external dams 240b and the second dams 245b. The internal open area 250b may be formed in the second internal area $I_2$. The shapes and mutual relationships of the external, middle and internal open areas 230b, 235b and 250b and the first and second dams 240b and 245b are described with reference to FIG. 2B. The monitoring pattern 200b includes the first and second dams 240b and 245b, thereby better preventing or reducing the flow of fluid materials.

Figure 2C:
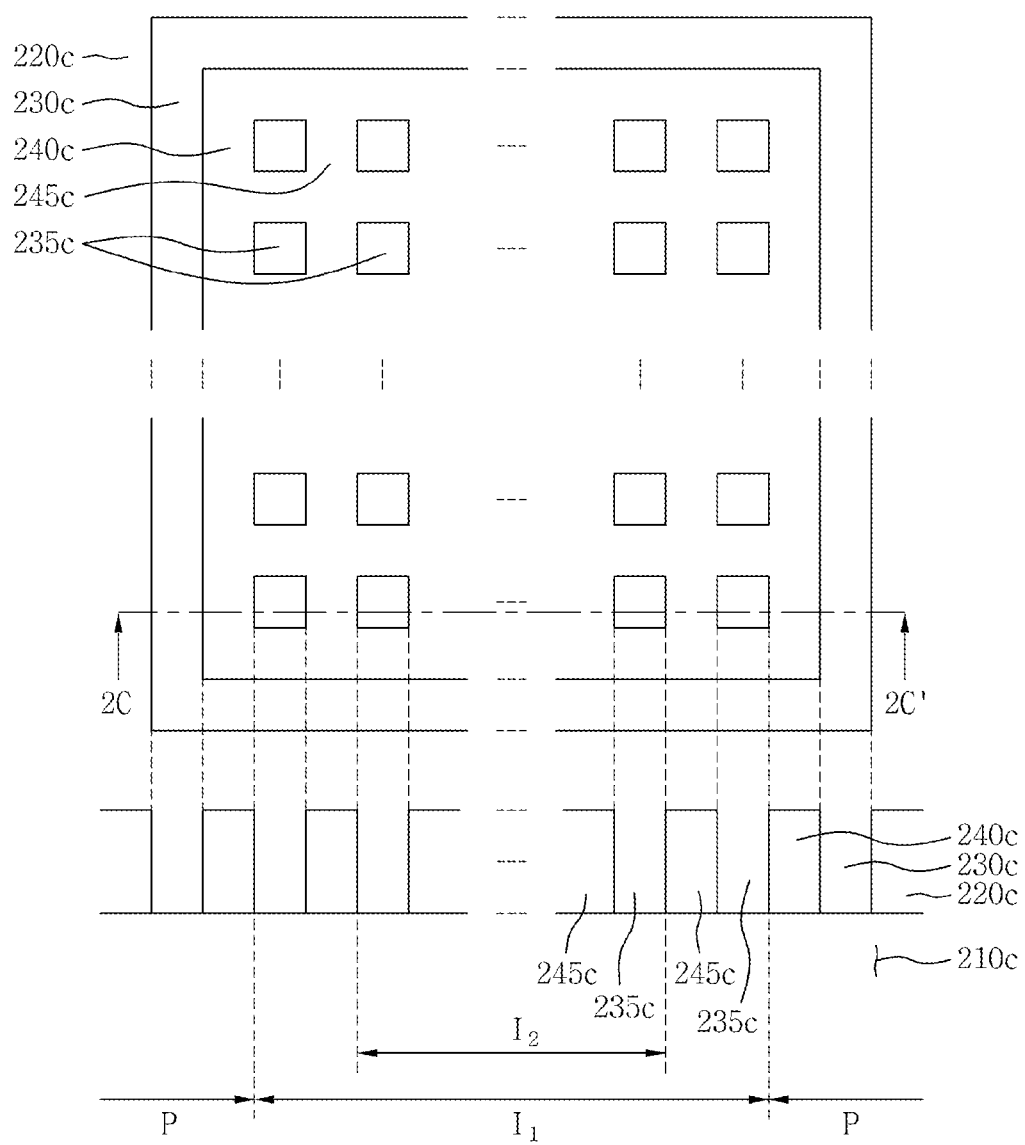

FIG. 2C shows a schematic top view of a monitoring pattern formed in one of I/O pad array areas according to example embodiments of the inventive concepts, and a longitudinal sectional view of the monitoring pattern along line 2C-2C'. Referring to FIG. 2C, a monitoring pattern 200c is formed in an I/O pad array area. The monitoring pattern 200c may include a lower layer 210c, open areas 230c and 235c that expose a surface of the lower layer 210c, and dams 240c and 245c. The open areas 230c and 235c may include external open areas 230c and internal open areas 235c. The external open areas 230c are described with reference to FIGS. 2A and 2Bs.

The internal open areas 235c may be arranged as plural separate islands. The monitoring pattern 200c may also be formed in external structures 220c. The dams 240c and 245c include first dams 240c and plural second dams 245c arranged in the form of a lattice. The plural second dams 245c may be formed extending in horizontal and vertical directions. In other words, the plural second dams 245c may be formed as lattice shapes.

Figure 3A:
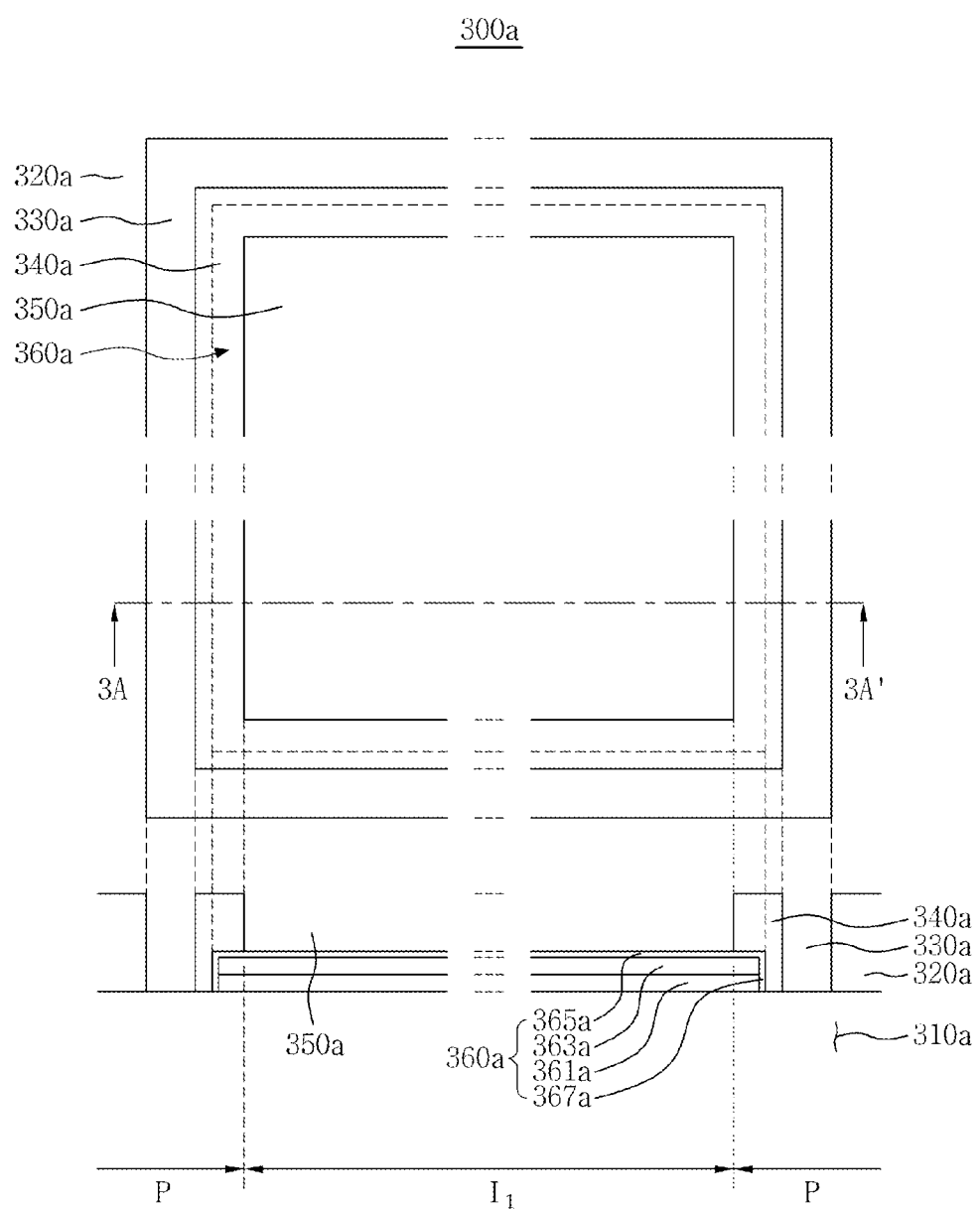

FIG. 3A shows a schematic top view of a monitoring pattern formed in one of I/O pad array areas according to example embodiments of the inventive concepts, and a longitudinal sectional view of the monitoring pattern along line 3A-3A'. Referring to FIG. 3A, a monitoring pattern 300a is formed in an I/O pad array area. The monitoring pattern 300a may include a lower layer 310a, open areas 330a and 350a, dams 340a, and a dummy pattern 360a. The open areas 330a and 350a may include external open areas 330a and an internal open area 350a. The dams 340a may be formed between the external open areas 330a and the internal open area 350a. The monitoring pattern 300a may also be formed in external structures 320a. The dummy pattern 360a may be formed directly on the lower layer 310a.

The dummy pattern 360a may include a gate stack structure. For example, the dummy pattern 360a may include a polysilicon layer 361a, a silicide layer 363a, a capping layer 365a, and a sidewall 367a of the gate stack structure. The silicide layer 363a may be a metal layer. The capping layer 365a may be formed of silicon nitride. The sidewall 367a may include silicon oxide or silicon nitride. The dummy pattern 360a may be formed as a large plate. The external open areas 330a may expose a surface of the lower layer 310a. The internal open area 350a may expose a surface of the dummy pattern 360a. The dams 340a may overlap the edge of the dummy pattern 360a. In other words, a portion of the dams 340a may be formed on the dummy pattern 360a.

Figure 3B:
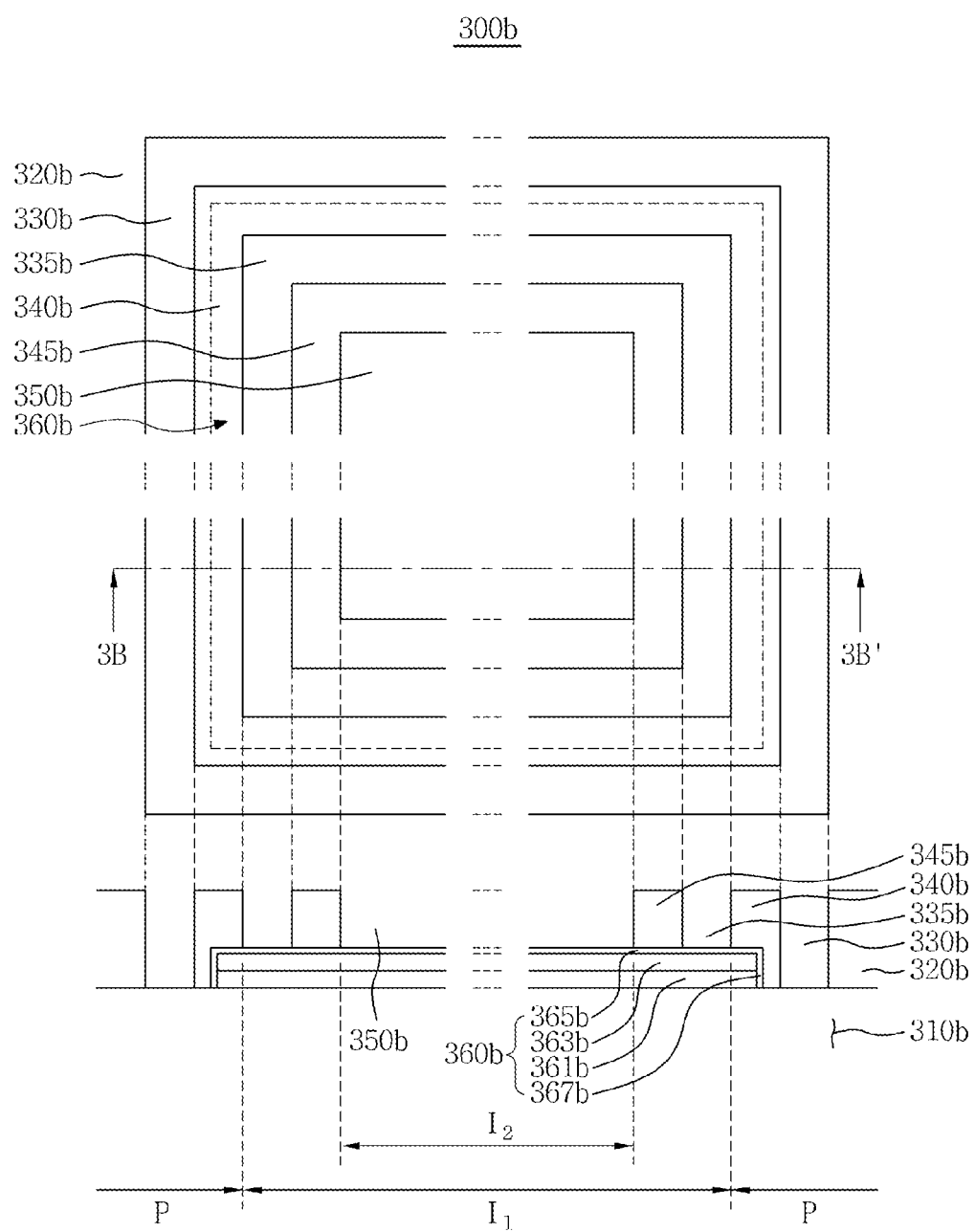

FIG. 3B shows a schematic top view of a monitoring pattern formed in one of I/O pad array areas according to example embodiments of the inventive concepts, and a longitudinal sectional view of the monitoring pattern along line 3B-3B'. Referring to FIG. 3B, a monitoring pattern 300b is formed in an I/O pad array area. The monitoring pattern 300b may include a lower layer 310b, open areas 330b, 335b and 350b, dams 340b and 345b, and a dummy pattern 360b. The open areas 330b, 335b and 350b include external open areas 330b and internal open areas 335b and 350b. The external open areas 330b may be formed in a band shape between external structures 320b and the external dams 340b. The internal open areas 335b and 350b include first internal open areas 335b and a second internal open area 350b. The dams 340b and 345b include external dams 340b and internal dams 345b. The external dams 340b may be formed in a band shape between the external open areas 330b and the first internal open areas 335b. The first internal open areas 335b may be disposed in a band shape between the external dams 340b and the internal dams 345b.

The internal dams 345b may be formed in a band shape between the first internal open areas 335b and the second internal open area 350b. The dummy pattern 360b may be formed directly on the lower layer 310b. The dummy pattern 360b may also include a gate stack structure. Respective components 361b, 363b, 365b and 367b of the dummy pattern 360b are described with reference to FIG. 3A. The dummy pattern 360b may also be formed as a large plate. The internal open areas 335b and 350b may expose a surface of the dummy pattern 360b. The external open areas 330b may expose a surface of the lower layer 310b. The external dams 340b may overlap the edge of the dummy pattern 360b. In other words, a portion of the external dams 340a may be formed on the dummy pattern 360b. The internal dams 345b may be formed on the dummy pattern 360b.

Figure 3C:
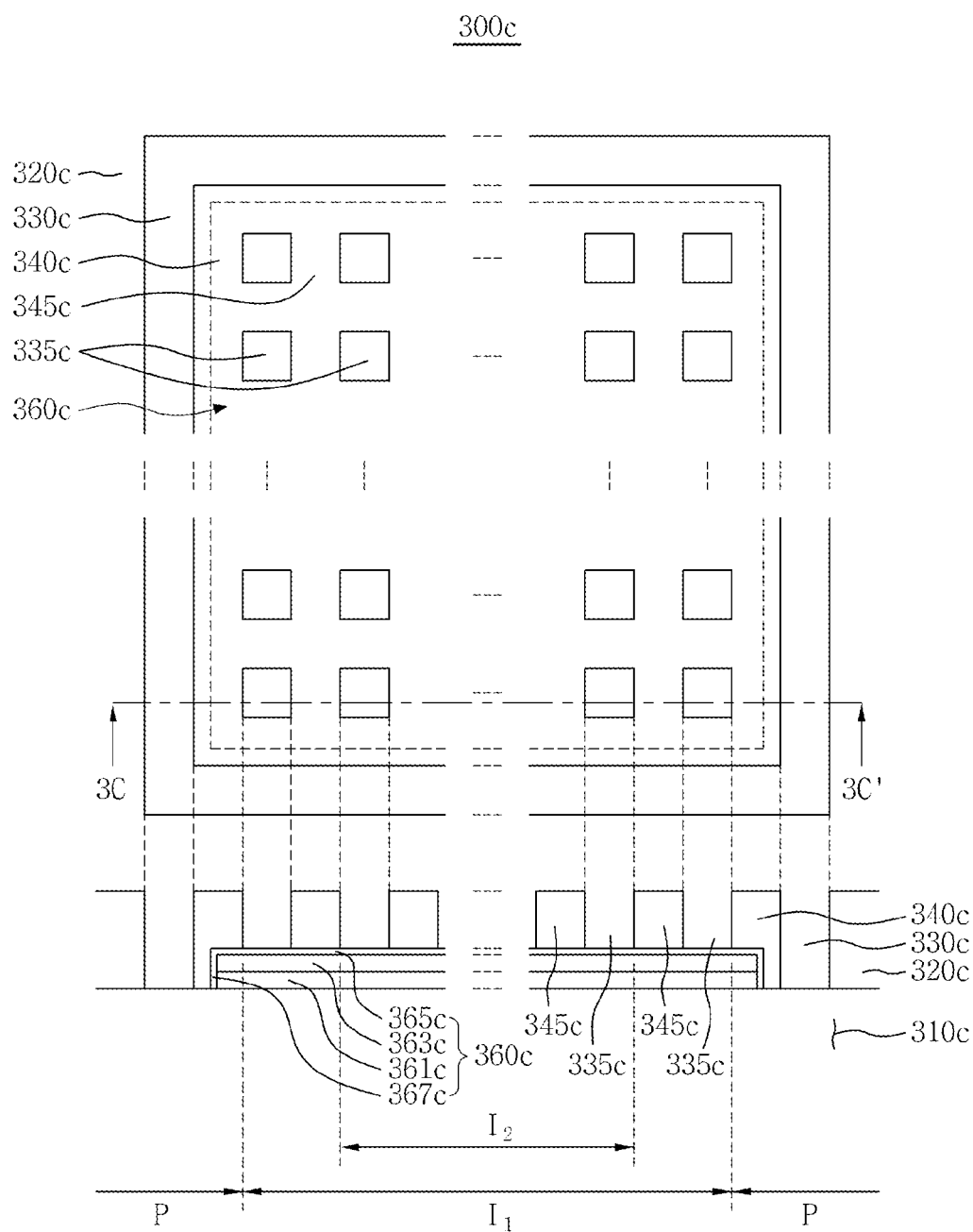

FIG. 3C shows a schematic top view of a monitoring pattern formed in one of I/O pad array areas according to example embodiments of the inventive concepts, and a longitudinal sectional view of the monitoring pattern along line 3C-3C'. Referring to FIG. 3C, a monitoring pattern 300c is formed in an I/O pad array area. The monitoring pattern 300c may include a lower layer 310c, open areas 330c and 335c, dams 340c and 345c, and a dummy pattern 360c. Respective components 361c 363c, 365c and 367c included in the dummy pattern 360c are described with reference to FIG. 3A. The monitoring pattern 300c may also be formed in external structures 320c. The open areas 330c and 335c include external open areas 330c and internal open areas 335c. The external open areas 330c may expose a surface of the lower layer 310c. The internal open areas 335c may expose a surface of the dummy pattern 360c. The internal open areas 335c may be arranged as islands. The dams 340c and 345c include external dams 340c and internal dams 345c. The external dams 340c may be formed in a band shape along the external open areas 330c, and the internal dams 345c may be formed as plural linear patterns that are parallel in horizontal and vertical directions and cross each other. The external dams 340c and the internal dams 345c may be physically connected. The external dams 340c and the internal dams 345c may be formed as lattice shapes.

Figure 4A:
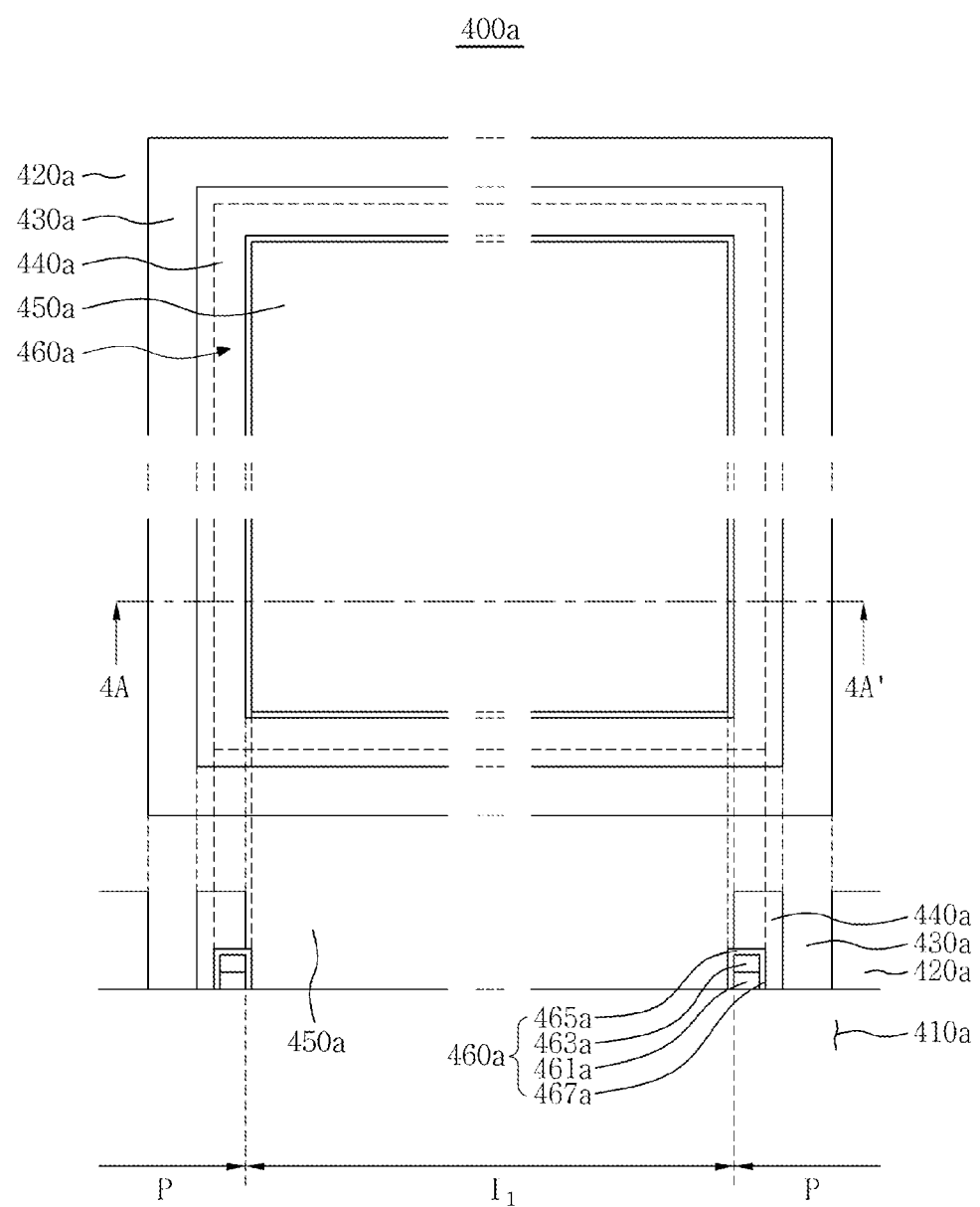

FIG. 4A shows a schematic top view of a monitoring pattern formed in one of I/O pad array areas according to example embodiments of the inventive concepts, and a longitudinal sectional view of the monitoring pattern along line 4A-4A'. Referring to FIG. 4A, a monitoring pattern 400a is formed in an I/O pad array area. The monitoring pattern 400a may include a lower layer 410a, open areas 430a and 450a, dams 440a, and dummy patterns 460a. The open areas 430a and 450a may include external open areas 430a and an internal open area 450a. The dams 440a may be formed between the external open areas 430a and the internal open area 450a. The monitoring pattern 400a may also be formed in external structures 420a.

The dummy patterns 460a may be formed directly on the lower layer 410a. The dummy patterns 460a may include a gate stack structure. For example, the dummy patterns 460a may include a polysilicon layer 461a, a silicide layer 463a, a capping layer 465a, and a sidewall 467a of the gate stack structure. The silicide layer 463a may include a metal layer. The capping layer 465a may include silicon nitride. The sidewall 467a may include silicon oxide or silicon nitride. The dummy patterns 460a may be formed to be the same as or similar to the gate stack structure. Although not shown in the drawing to avoid complicating the drawing, the dummy patterns 460a may further include a gate insulating layer between the lower layer 410a and the polysilicon layer 461a. Also, when the dummy patterns 460a are applied to flash memory semiconductor device technology, the polysilicon layer 461a may correspond to a floating gate, and the silicide layer 463a may correspond to a control gate. An inter-gate dielectric layer (not shown) may be additionally formed between the polysilicon layer 461a and the silicide layer 463a.

The inter-gate dielectric layer may be formed of plural layers of a silicon oxide layer/silicon nitride layer/silicon oxide layer. The dummy patterns 460a may be formed along the dams 440a in a shape that is the same as or similar to the dams 440a. For example, the dummy patterns 460a may be formed in a quadrangular band shape or four bar shapes. Unlike the dams 440a, all the dummy patterns 460a need not be connected as a single body. In the drawing, the boundaries of the dummy patterns 460a covered by the dams 440a are indicated by dotted lines. The external open areas 430a may expose a surface of the lower layer 410a.

The internal open area 450a may expose the lower layer 410a and also portions of the dummy patterns 460a. The dams 440a may overlap the edges of the dummy patterns 460a. In other words, portions of the dams 440a may be formed on the dummy patterns 460a. Also, the dams 440a may completely surround the dummy patterns 460a. When the dummy patterns 460a are completely surrounded by the dams 440a, the internal open area 450a may not expose the dummy patterns 460a at all.

Figure 4B:
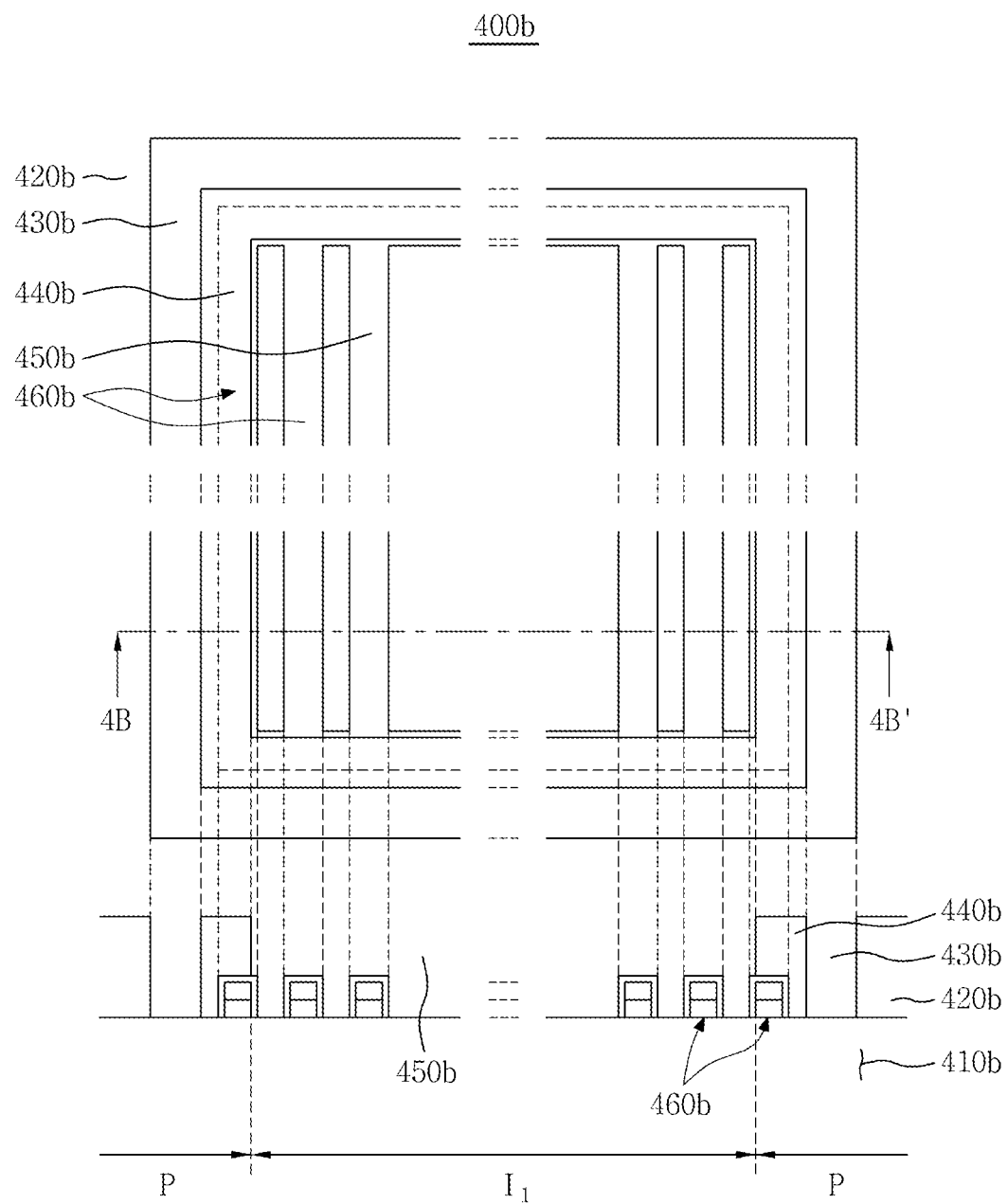

FIG. 4B shows a schematic top view of a monitoring pattern formed in one of I/O pad array areas according to example embodiments of the inventive concepts, and a longitudinal sectional view of the monitoring pattern along line 4B-4B'. Referring to FIG. 4B, a monitoring pattern 400b is formed in an I/O pad array area. The monitoring pattern 400b may include a lower layer 410b, open areas 430b and 450b, dams 440b, and dummy patterns 460b. The open areas 430b and 450b include external open areas 430b and an internal open area 450b. The dams 440b may be formed between the external open areas 430b and the internal open area 450b. The monitoring pattern 400b may also be formed in external structures 420b. The dummy patterns 460b are described with reference to FIG. 4A. Also, the dummy patterns 460b may be formed in a plural parallel line or bar shape. Furthermore, the dummy patterns 460b may be formed in a lattice shape referring to FIGS. 2C and 3C.

The external open areas 430b may expose the lower layer 410b. The internal open area 450b may expose only a surface of the lower layer 410b, only portions of the dummy patterns 460b, or one entire dummy pattern 460b. In the drawing, the internal open area 450b exposes a surface of the lower layer 410b, two entire dummy patterns 460b, and portions of other dummy patterns 460b. The dummy patterns 460b may be formed in a single body. However, the dummy patterns 460b do not have to be formed in a single body. In other words, the dummy patterns 460b may include at least one portion at which the dummy patterns 460b are not physically connected with each other.

Figure 5A:
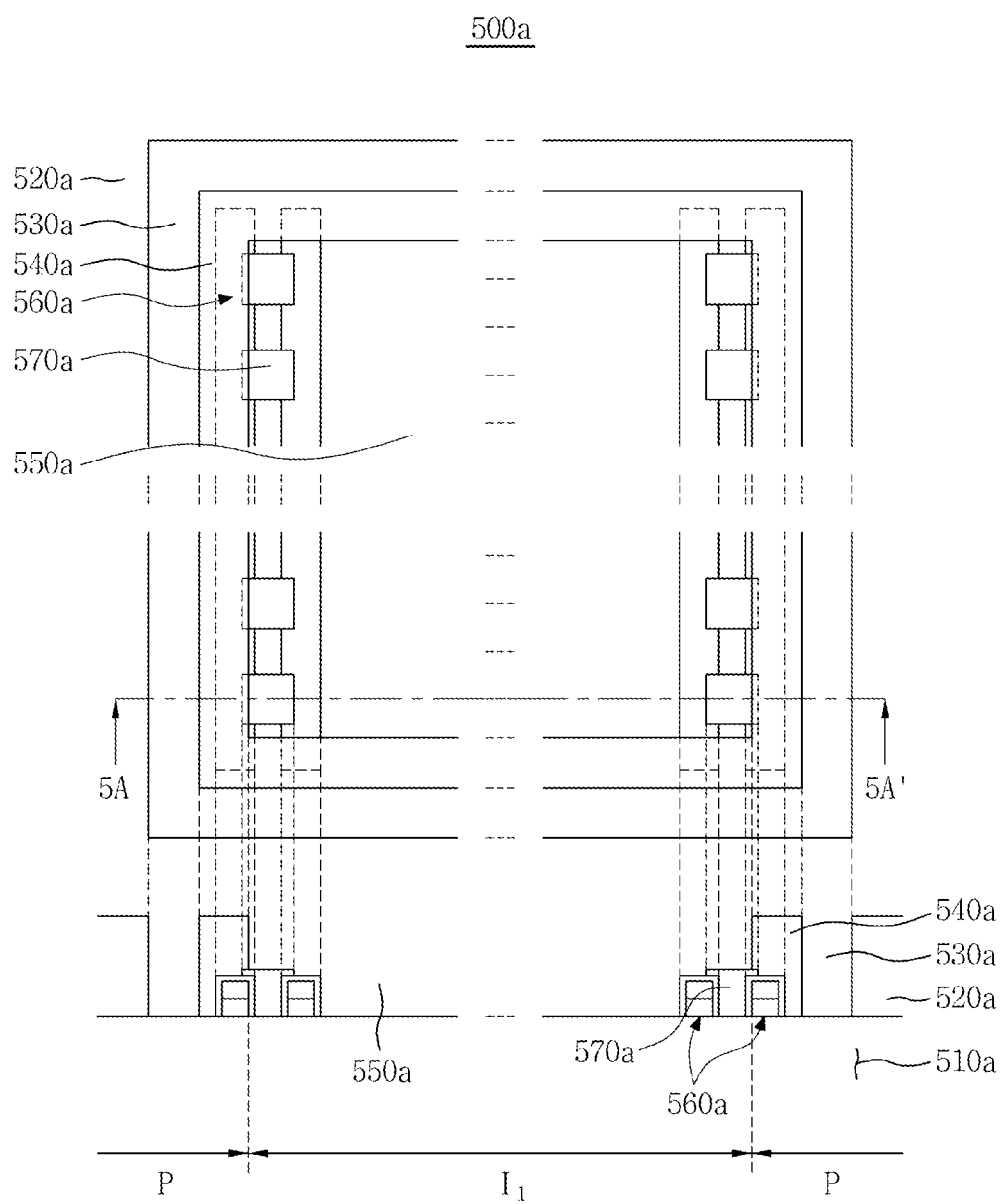

FIG. 5A shows a schematic top view of a monitoring pattern formed in one of I/O pad array areas according to example embodiments of the inventive concepts, and a longitudinal sectional view of the monitoring pattern along line 5A-5A'. Referring to FIG. 5A, a monitoring pattern 500a is formed in an I/O pad array area. The monitoring pattern 500a may include a lower layer 510a, open areas 530a and 550a, dams 540a, dummy patterns 560a, and dummy contacts 570a. The monitoring pattern 500a may also be formed in external structures 520a. The lower layer 510a, the open areas 530a and 550a, the dams 540a, and the dummy patterns 560a are described with reference to FIGS. 4A and 4B.

The dummy contacts 570a may be formed between the dummy patterns 560a. The dummy contacts 570a may be formed in a pillar or plug shape in the side view. The dummy contacts 570a may be formed as islands in the top view. However, the dummy contacts 570a do not have to be formed as islands. For example, the dummy contacts 570a may be formed in a linear or bar shape to fill a valley between the dummy patterns 560a. A plural number of the dummy contacts 570a may be arranged in a direction in which the dummy patterns 560a are extended.

Figure 5B:
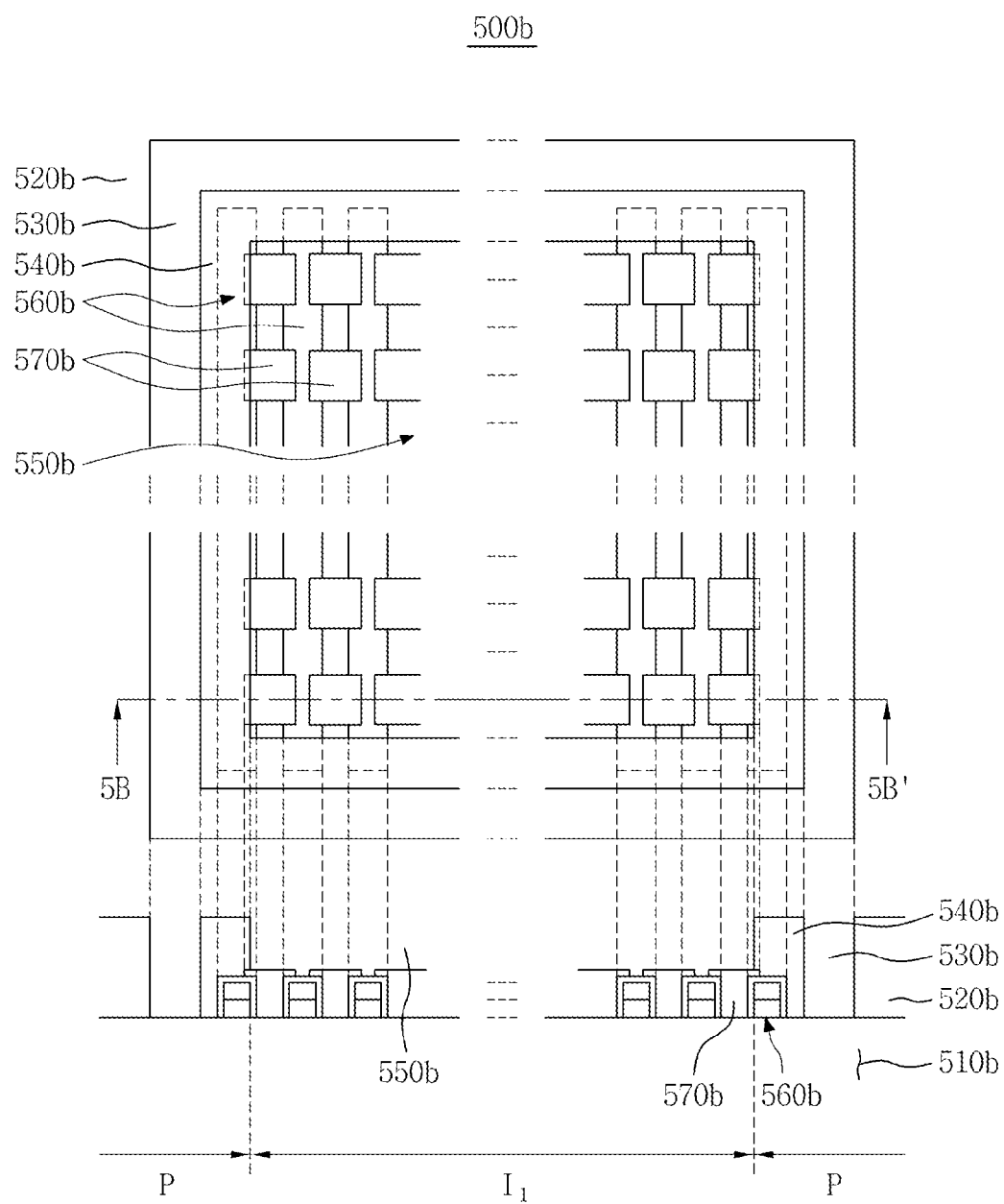

FIG. 5B shows a schematic top view of a monitoring pattern formed in one of I/O pad array areas according to example embodiments of the inventive concepts, and a longitudinal sectional view of the monitoring pattern along line 5B-5B'. Referring to FIG. 5B, a monitoring pattern 500b is formed in an I/O pad array area. The monitoring pattern 500b may include a lower layer 510b, open areas 530b and 550b, dams 540b, dummy patterns 560b, and dummy contacts 570b. The monitoring pattern 500b may also be formed in external structures 520b. The lower layer 510b, the open areas 530b and 550b, and the dams 540b are described with reference to FIGS. 4B and 5A. The dummy patterns 560b are described with reference to FIG. 4B.

Specifically, the dummy patterns 560b may be formed in a plural parallel line or bar shape, or a lattice shape. The dummy contacts 570b are described with reference to FIG. 5A. A plural number of the dummy contacts 570b may also be arranged in a direction perpendicular to a direction in which the dummy patterns 560b are extended. The dummy contacts 570b may be arranged in the form of a lattice. The dummy contacts 570b may be arranged in a "+" shape to be parallel in horizontal and vertical directions and cross each other, or in a "x" shape to be parallel with two diagonal lines crossing at right angles.

A method of fabricating a monitoring pattern in one of I/O pad array areas according to example embodiments of the inventive concepts will be described below. In the method, the monitoring pattern 500a shown in FIG. 5A will be fabricated as an example of various monitoring patterns. Methods of fabricating respective monitoring patterns according to other example embodiments of the inventive concepts will be easily inferred from the following description.

Figure 6A:
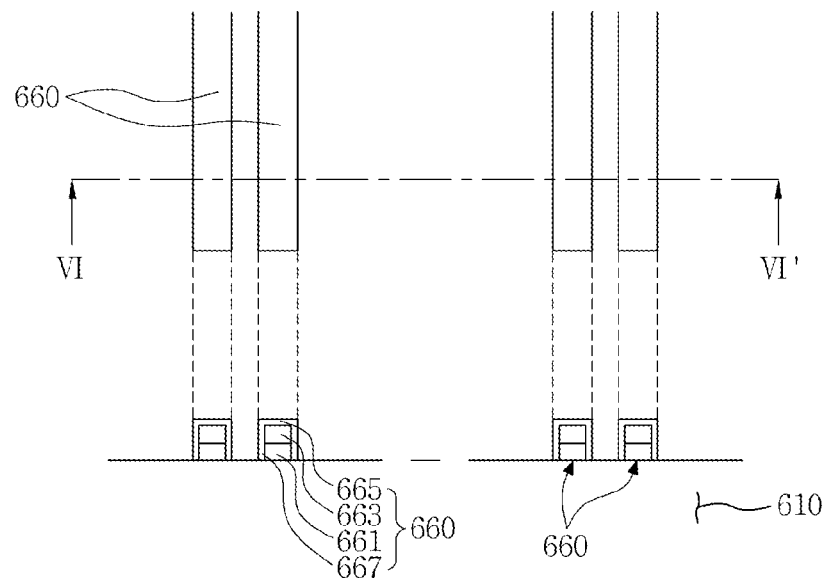
FIGS. 6A through 6G show top views and longitudinal sectional views illustrating a method of fabricating a process monitoring pattern according to example embodiments of the inventive concepts.

FIGS. 6A through 6G show schematic top views and longitudinal sectional views along line VI-VI', illustrating a method of fabricating a monitoring pattern in one of I/O pad array areas according to example embodiments of the inventive concepts. Referring to FIG. 6A, gate stack structures 660 are formed on a substrate 610 overlapping an I/O pad array area. The gate stack structures 660 may include polysilicon layers 661, silicide layers 663, capping layers 665, and sidewalls 667. The polysilicon layers 661, the silicide layers 663, the capping layers 665, and the sidewalls 667 are typical components of the gate stack structures 660 to aid in understanding example embodiments of the inventive concepts. The gate stack structures 660 may be formed to have the same structure as a cell transistor, that is, a cell gate structure in a cell region of a semiconductor device. For example, in dynamic random access memory (DRAM) semiconductor device technology, the gate stack structures 660 may further include a gate insulating layer between the substrate 610 and the polysilicon layers 661, and the silicide layers 663 may include metal layers.

Also, in flash memory semiconductor device technology, the polysilicon layers 661 of the gate stack structures 660 may correspond to floating gates, and the silicide layers 663 may correspond to control gates. Inter-gate dielectric layers may be additionally formed between the floating gates and the control gates. The inter-gate dielectric layers may include plural layers of a silicon oxide layer/silicon nitride layer/silicon oxide layer. The gate stack structures 660 may be formed at the same time in the same process as a cell gate formed in the cell region of the semiconductor device.

Figure 6B:
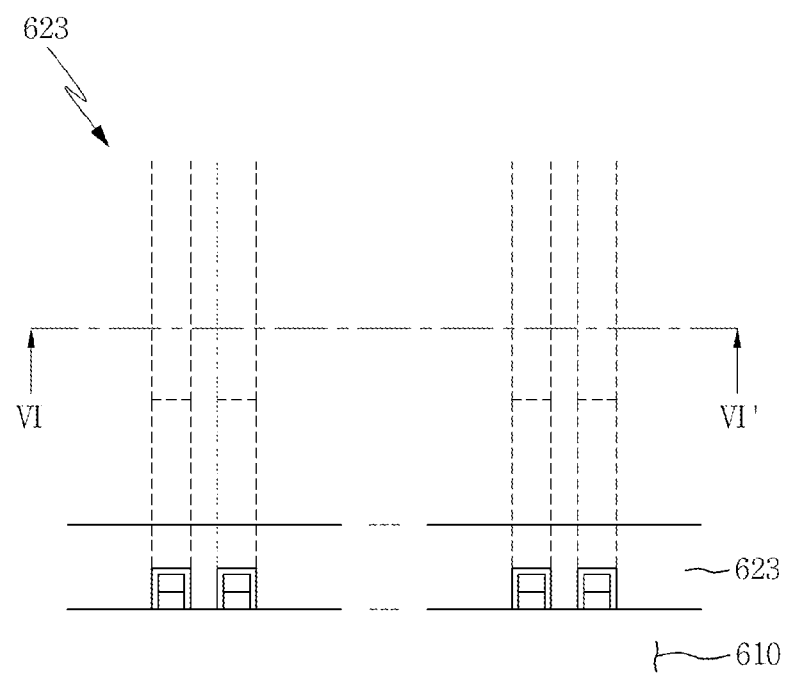

Referring to FIG. 6B, a first insulating layer 623 is formed on an entire area overlapping the I/O pad array area. The first insulating layer 623 may be formed to completely cover the gate stack structures 660. The first insulating layer 623 is a silicon oxide layer, and may be formed of the same material and/or in the same process as an interlayer insulating layer formed in the cell region of the semiconductor device.

Figure 6C:
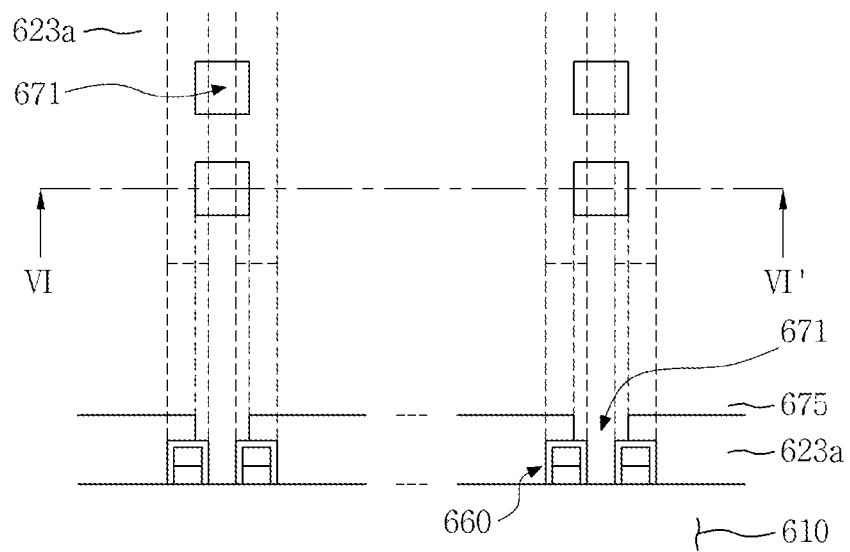

Referring to FIG. 6C, a first insulating layer pattern 623a is formed. The first insulating layer pattern 623a may include contact holes 671. The contact holes 671 may expose a surface of the substrate 610 between the adjacent gate stack structures 660. The contact holes 671 may be formed as islands at separate positions. The contact holes 671 may be formed in a contact forming process in which the cell region of the semiconductor device is formed. This process is also referred to as a contact pad hole forming process, a landing pad hole forming process, a lower contact hole forming process, etc.

Figure 6D:
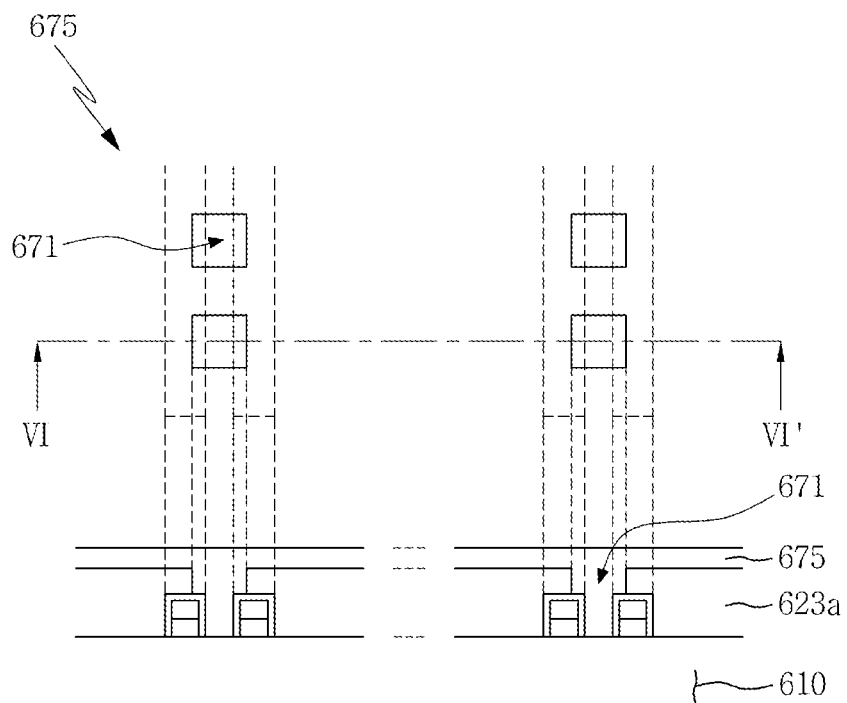

Referring to FIG. 6D, plugs 675 that fill the contact holes 671 are formed on the first insulating layer pattern 623a. The plugs 675 may include silicon. The plugs 675 may be formed of the same material and/or in the same process as a cell contact plug formed in the cell region of the semiconductor device. The cell contact plug is also referred to as a contact pad, a landing pad, a lower contact plug, a self-aligned contact, etc.

Figure 6E:
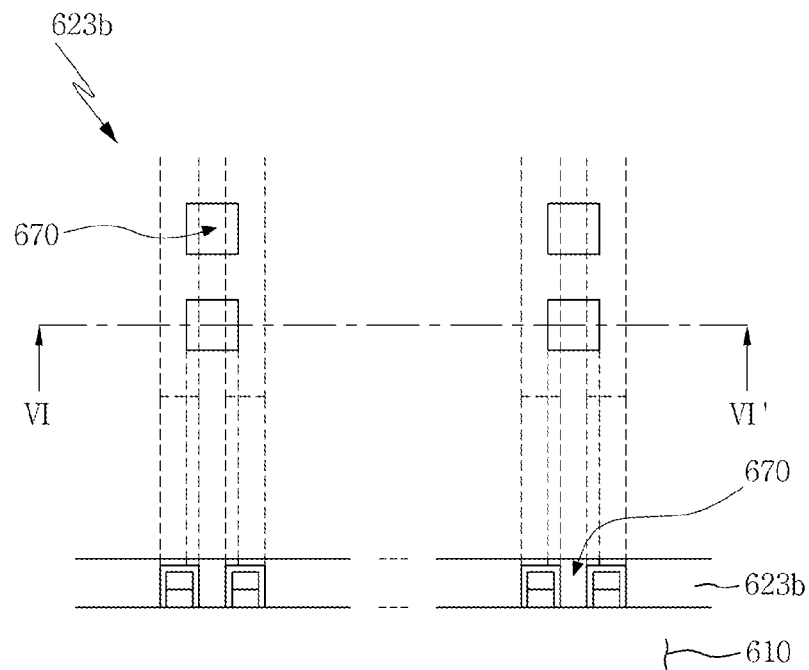

Referring to FIG. 6E, a planarization process is performed to form contact plugs 670. An etch-back process or a chemical mechanical polishing (CMP) process may be performed as the planarization process. In this process, the height of the first insulating pattern 623a may be reduced to form a first insulating pattern 623b.

Figure 6F:
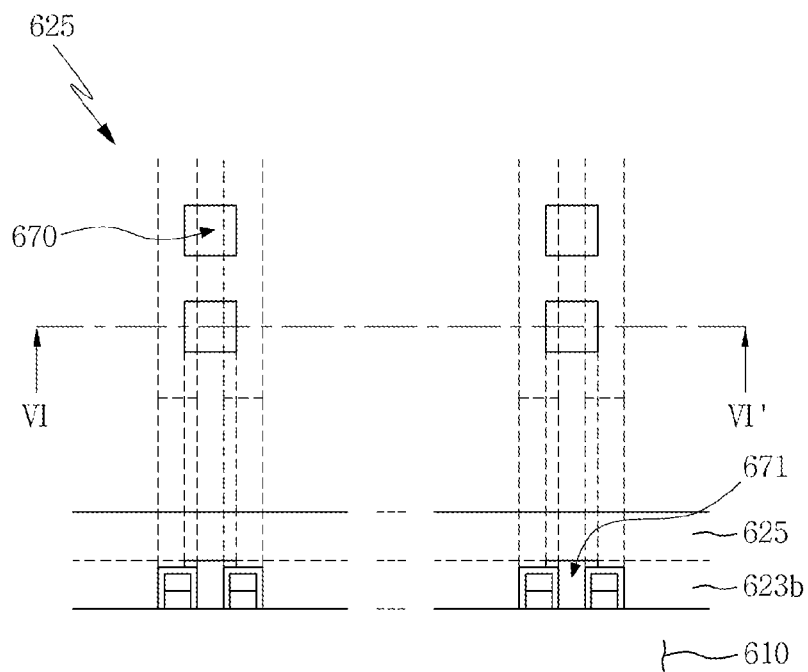

Referring to FIG. 6F, a second insulating layer 625 is formed all over the contact plugs 670 and the first insulating layer pattern 623b. The second insulating layer 625 may include a silicon oxide layer, and be formed of the same material and/or in the same process as an interlayer insulating layer among processes of forming various interlayer insulating layers in the cell region of the semiconductor device. For example, the second insulating layer 625 may be formed in one of processes of forming interlayer insulating layers on higher levels than the upper surfaces of the cell gates in the cell region. In this process, when the first insulating layer pattern 623b having a reduced height and the second insulating layer 625 are formed of the same materials, e.g., a silicon oxide layer, a boundary between the first insulating layer 623b and the second insulating layer 625 may be disappeared. Thus, the boundary is indicated by a dotted line for an imaginary in the drawing.

Figure 6G:
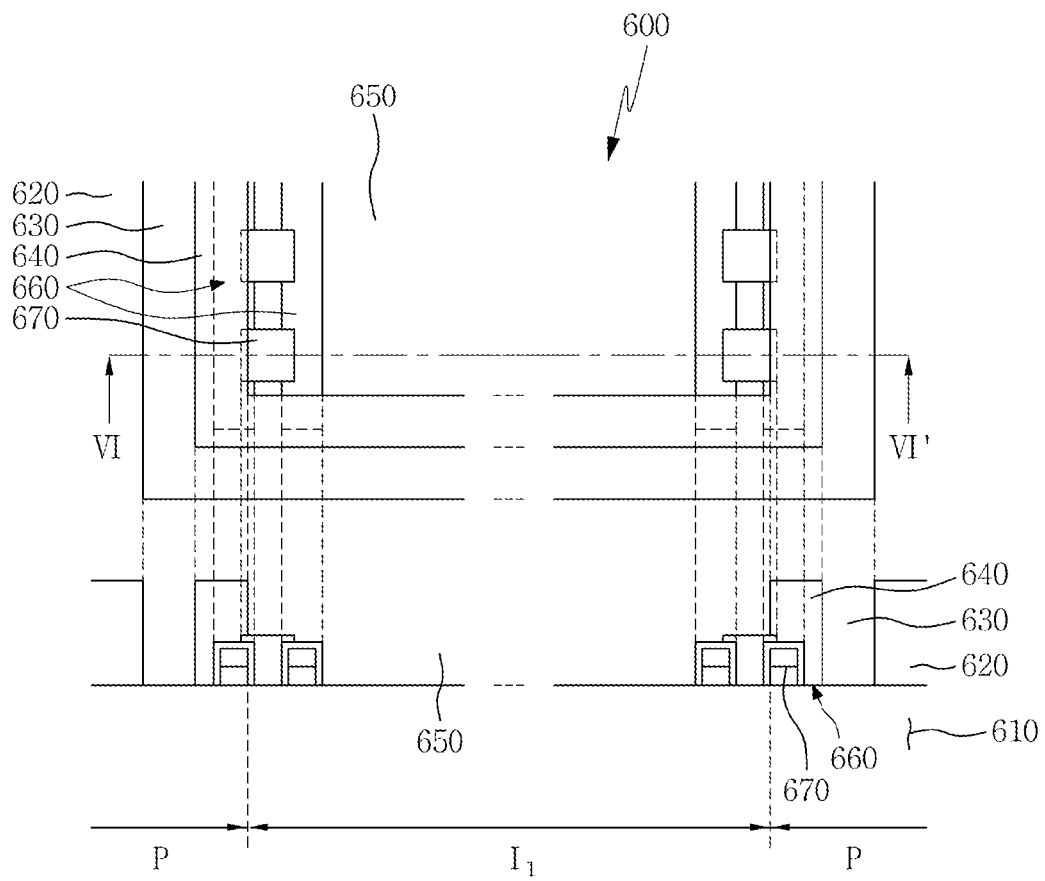

Referring to FIG. 6G, external structures 620, open areas 630 and 650, and dams 640 are formed. The external structures 620 may define an area in which a monitoring pattern 600 is formed. The open areas 630 and 650 may include external open areas 630 and an internal open area 650. The external open areas 630 may expose a surface of the substrate 610, and the internal open area 650 may exposes the surface of the substrate 610, portions of the gate stack structures 660, and surfaces of the plugs 670. The external open areas 630 may be formed in a quadrangular band shape along the external structures 620. The internal open area 650 may be formed in a large quadrangular window shape. The dams 640 may be disposed in quadrangular band shapes between the external open areas 630 and the internal open area 650.

From the above description, methods of fabricating monitoring patterns overlapping an I/O pad array area according to example embodiments of the inventive concepts shown in FIGS. 2A through 5B will be easily inferred.

Figure 7:
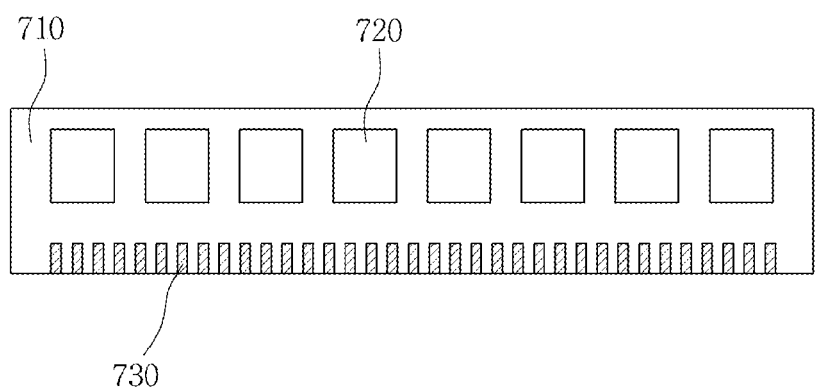
FIGS. 7 through 9 are schematic diagrams of a semiconductor module, an electronic circuit board, and an electronic system including a semiconductor device including a process monitoring pattern according to example embodiments of the inventive concepts.

FIG. 7 is a schematic diagram of a semiconductor module including a semiconductor device including a process monitoring pattern overlapping an I/O pad array area according to example embodiments of the inventive concepts. Referring to FIG. 7, a semiconductor module 700 according to example embodiments of the inventive concepts includes a module substrate 710, a plurality of semiconductor devices 720 disposed on the module substrate 710, and module contact terminals 730 formed in a line on one edge of the module substrate 710 and electrically connected with the semiconductor devices 720. The module substrate 710 may be a printed circuit board (PCB). Both surfaces of the module substrate 710 may be used. In other words, the semiconductor devices 720 may be disposed on the front side and the back side of the module substrate 710. It is shown in FIG. 7 that eight semiconductor devices 720 are disposed on the front side of the module substrate 710, but this is merely an example.

The semiconductor module 700 may further include a logic semiconductor device for controlling the semiconductor devices or the semiconductor packages. Thus, the number of the semiconductor devices 720 constituting the semiconductor module 700 shown in FIG. 7 is variable. At least one of the semiconductor devices 720 may include a process monitoring pattern overlapping an I/O pad array area according to example embodiments of the inventive concepts. The module contact terminals 730 may be formed of a metal, and may have resistance to oxidation. The module contact terminals 730 may be set to vary according to the standard of the semiconductor module 700. Thus, the number of module contact terminals 730 shown in the drawing is not meaningful.

Figure 8:
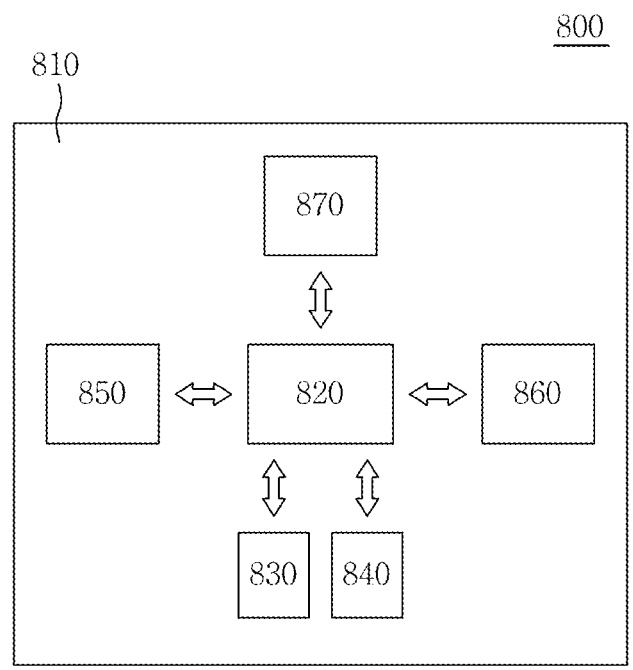

FIG. 8 is a schematic block diagram of an electronic circuit board including a semiconductor device including a process monitoring pattern overlapping an I/O pad array area according to example embodiments of the inventive concepts. Referring to FIG. 8, an electronic circuit board 800 according to example embodiments of the inventive concepts includes a microprocessor 820 disposed on a circuit board 810, a main storage circuit 830 and a supplementary storage circuit 840 communicating with the microprocessor 820, an input signal processing circuit 850 sending an instruction to the microprocessor 820, an output signal processing circuit 860 receiving an instruction from the microprocessor 820, and a communicating signal processing circuit 870 exchanging electrical signals with other circuit boards. Arrows denote paths through which electrical signals can be transferred. The microprocessor 820 may receive and process a variety of electrical signals to output the processed results, and may control other components of the electronic circuit board 810. The microprocessor 820 may be, for example, a central processing unit (CPU), a main control unit (MCU), etc.

The main storage circuit 830 may temporarily store data that is always or frequently required for pre- and post-processing data. The main storage circuit 830 requires a rapid response and thus may be a semiconductor memory. Specifically, the main storage circuit 830 may be a semiconductor memory referred to as cache, or may include a static RAM (SRAM), a DRAM, a resistive RAM (RRAM), and applied semiconductor memories, for example, a utilized RAM, a ferro-electric RAM, a fast cycle RAM, a phase changeable RAM, a magnetic RAM, and other semiconductor memories. The main storage circuit 830 may be volatile or non-volatile, and may include a RAM. In this example embodiment of the inventive concepts, the main storage circuit 830 may include at least one semiconductor device including a process monitoring pattern overlapping an I/O pad array area according to an example embodiment of the inventive concepts, or at least one semiconductor module 700 including the semiconductor device.

The supplementary storage circuit 840 is a mass storage device, and may be a non-volatile semiconductor memory such as a flash memory, a hard disk drive (HDD) using a magnetic field, or a compact disk (CD) drive using light. The supplementary storage circuit 840 may be used to store a relatively large amount of data without requiring a higher speed than the main storage circuit 830. The supplementary storage circuit 840 may include a random access memory and/or non-random access memory such as a non-volatile storage device. The supplementary storage circuit 840 may include at least one semiconductor device including a process monitoring pattern overlapping an I/O pad array area according to an example embodiment of the inventive concepts, or at least one semiconductor module 700 including the semiconductor device. The input signal processing circuit 850 may convert an external instruction into an electrical signal or transfer an electrical signal received from the outside to the microprocessor 820.

The instruction or electrical signal received from the outside may be an operation instruction, an electrical signal to be processed, or data to be stored. The input signal processing circuit 850 may be a terminal signal processing circuit that processes a signal transferred from a keyboard, a mouse, a touchpad, an image recognition device, or a variety of sensors, an image signal processing circuit that processes an image signal input from a scanner or a camera, various sensors or an input signal interface, or so on. The input signal processing circuit 850 may include at least one semiconductor device including a process monitoring pattern overlapping an I/O pad array area according to an example embodiment of the inventive concepts, or at least one semiconductor module 700 including the semiconductor device.

The output signal processing circuit 860 may be a component for transferring an electrical signal processed by the microprocessor 820 to the outside. For example, the output signal processing circuit 860 may be a graphic card, an image processor, an optical transducer, a beam panel card, or an interface circuit having various functions. The output signal processing circuit 860 may include at least one semiconductor device including a process monitoring pattern overlapping an I/O pad array area according to an example embodiment of the inventive concepts, or at least one semiconductor module 700 including the semiconductor device.

The communicating signal processing circuit 870 is a component for directly exchanging electrical signals with another electronic system or another circuit board not through the input signal processing circuit 850 or the output signal processing circuit 860. For example, the communicating signal processing circuit 870 may be a modem, a local area network (LAN) card, various interface circuits, etc. of a personal computer (PC) system. The communicating signal processing circuit 870 may include at least one semiconductor device including a process monitoring pattern overlapping an I/O pad array area according to an example embodiment to the inventive concepts, or at least one semiconductor module 700 including the semiconductor device.

Figure 9:
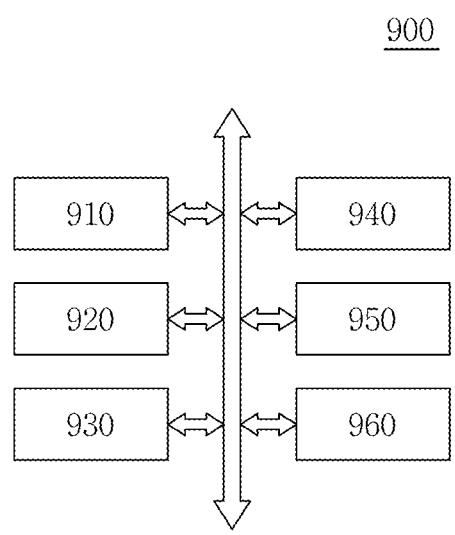

FIG. 9 is a schematic block diagram of an electronic system including a semiconductor device including a process monitoring pattern overlapping an I/O pad array area according to example embodiments of the inventive concepts, or a semiconductor module including the semiconductor device. Referring to FIG. 9, an electronic system 900 according to example embodiments of the inventive concepts includes a control unit 910, an input unit 920, an output unit 930, and a storage unit 940, and may further include a communication unit 950 and/or an operation unit 960. The control unit 910 may control the electronic system 900 and all the respective units.

The control unit 910 may be considered a central processor or a central controller, and may include the electronic circuit board 800 according to example embodiments of the inventive concepts. Also, the control unit 910 may include at least one semiconductor device including a process monitoring pattern overlapping an I/O pad array area according to an example embodiment of the inventive concepts, or at least one semiconductor module 700 including the semiconductor device. The input unit 920 may send an electrical instruction signal to the control unit 910. The input unit 920 may be a keyboard, a keypad, a mouse, a touchpad, an image recognizer such as a scanner, or various input sensors.

The input unit 920 may include at least one semiconductor device including a process monitoring pattern overlapping an I/O pad array area according to an example embodiment of the inventive concepts, or at least one semiconductor module 700 including the semiconductor device. The output unit 930 may receive the electrical instruction signal from the control unit 910 and output a result processed by the electronic system 900. The output unit 930 may be a monitor, a printer, a beam projector, or various mechanical devices. The output unit 930 may include at least one semiconductor device including a process monitoring pattern overlapping an I/O pad array area according to an example embodiment of the inventive concepts, or at least one semiconductor module 700 including the semiconductor device.

The storage unit 940 may be a component for temporarily or permanently storing an electrical signal that will be processed or has been processed by the control unit 910. The storage unit 940 may be physically and electrically connected or combined with the control unit 910. The storage unit 940 may be a semiconductor memory, a magnetic storage device such as a HDD, an optical storage device such as a CD, or a server having other data storage functions. Also, the storage unit 940 may include at least one semiconductor device including a process monitoring pattern overlapping an I/O pad array area according to an example embodiment of the inventive concepts, or at least one semiconductor module 700 including the semiconductor device.

The communication unit 950 may receive the electrical instruction signal from the control unit 910 and send or receive an instruction signal to or from another electronic system. The communication unit 950 may be a wired transceiver device such as a modem and a LAN card, a wireless transceiver device such as a wireless broadband (WiBro) interface, an infrared port, etc. Also, the communication unit 950 may include at least one semiconductor device including a process monitoring pattern overlapping an I/O pad array area according to an example embodiment of the inventive concepts, or at least one semiconductor module 700 including the semiconductor device. The operation unit 960 may perform a physical or mechanical operation according to an instruction of the control unit 910.

For example, the operation unit 960 may be a component that performs a mechanical operation, such as a plotter, an indicator, and an up/down operator. An electronic system according to an example embodiment of the inventive concepts may be a computer, a network server, a networking printer or scanner, a wireless controller, a terminal for mobile communication, an exchanger, or an electronic product performing other programmed operations.

The names, functions, etc. of components that are not indicated by reference numerals in the drawings can be readily understood from other drawings and the descriptions.

As described above, in a semiconductor device according to example embodiments of the inventive concepts, a monitoring pattern is formed to overlap an I/O pad array area. Accordingly, reducing the width or area of a scribe lane may be possible. Also, an area on a wafer occupied by the semiconductor chip can be reduced, and thus the productivity of the semiconductor device can be improved.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of the inventive concepts as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of fabricating a semiconductor device, comprising:
    forming a first insulating layer on a lower layer overlapping an input/output (I/O) pad array area, the lower layer having a peripheral area surrounding a first internal area;
    patterning the first insulating layer to form an external structure on the peripheral area, the peripheral area having a quadrangular shape;
    forming a first dam in the peripheral area spaced apart from the external structure, the first dam defining the first internal area and having a quadrangular band shape; and
    exposing a surface of the lower layer between the external structure and the first dam to form an external open area, and the first internal area to form an internal open area.

2. The method according to claim 1, wherein forming the first insulating layer includes forming a second dam in the internal open area, the first dam and the second dam including a first internal open area therebetween, and a second internal area being exposed by a second internal open area.

3. The method according to claim 1, before forming the first insulating layer, further comprising:
    forming at least one gate stack structure on the lower layer.

4. The method according to claim 3, wherein a portion of the at least one gate stack structure is exposed by the internal open area.

5. The method according to claim 3, wherein the first dam overlaps a portion of the at least one gate stack structure.

6. The method according to claim 3, wherein the at least one gate stack structure includes at least two gate stack structures formed adjacent to each other, the method further comprising:
    forming a contact plug between the at least two adjacent gate stack structures.

7. A method of forming a semiconductor device, comprising:
    forming a process monitoring pattern on a substrate, wherein forming the process monitoring pattern includes,
        forming a lower layer on the substrate, the lower layer having a peripheral area surrounding a first internal area,
        forming an external structure on the peripheral area, the peripheral area having a quadrangular shape, and
        forming a first dam in the quadrangular peripheral area, the first dam defining the first internal area; and
    forming an input/output (I/O) pad array area overlapping the peripheral area.

8. The method according to claim 7, wherein the first dam is formed as a single body and has a quadrangular band shape when viewed from the top of the semiconductor device.

9. The method according to claim 7, wherein forming the process monitoring pattern further comprises:
    forming at least one dummy pattern in the first internal area of the lower layer,
    wherein a portion of the at least one dummy pattern overlaps the first dam.

10. The method according to claim 9, wherein forming the at least one dummy pattern includes forming at least two dummy patterns, and forming a contact plug between the at least two dummy patterns.

* * * * *